(12) United States Patent
Tellkamp

(10) Patent No.: US 9,239,353 B2
(45) Date of Patent: Jan. 19, 2016

(54) TESTING OF INTEGRATED CIRCUITS WITH EXTERNAL CLEARANCE REQUIREMENTS

(71) Applicant: Texas Instruments Incorporated, Dallas, TX (US)

(72) Inventor: John Paul Tellkamp, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 257 days.

(21) Appl. No.: 13/922,428

(22) Filed: Jun. 20, 2013

(65) Prior Publication Data

US 2014/0375350 A1     Dec. 25, 2014

(51) Int. Cl.
*G01R 31/26*     (2014.01)
*G01R 31/12*     (2006.01)
*G01R 31/28*     (2006.01)

(52) U.S. Cl.
CPC .......... *G01R 31/129* (2013.01); *G01R 31/2623* (2013.01); *G01R 31/2862* (2013.01)

(58) Field of Classification Search
None
See application file for complete search history.

(56) References Cited

U.S. PATENT DOCUMENTS

| | | | |
|---|---|---|---|
| 2009/0184760 A1* | 7/2009 | Hauenstein | 327/594 |
| 2012/0112365 A1* | 5/2012 | Ausserlechner et al. | 257/777 |
| 2014/0264677 A1* | 9/2014 | Ausserlechner | 257/427 |

* cited by examiner

*Primary Examiner* — Minh N Tang
(74) *Attorney, Agent, or Firm* — Steven A. Shaw; Frank D. Cimino

(57) ABSTRACT

A method of testing an integrated circuit clearance distance device ("ICCDD") having a predetermined clearance distance in air requirement and a predetermined isolation voltage limit including calculating a value of the breakdown voltage at the predetermined clearance distance for at least one gas; and selecting a gas in which the ICCDD has a breakdown voltage that is less than the predetermined isolation voltage.

20 Claims, 3 Drawing Sheets

TESTING OF INTEGRATED CIRCUITS WITH EXTERNAL CLEARANCE REQUIREMENTS

BACKGROUND

Integrated circuit isolation devices (ICID) have many applications in modern electronics, for example, battery chargers, motor controllers, voltage monitoring/metering, medical electronics such as automated external defibrillators (AEDs). A typical ICID has a first die mounted on a first die pad and a second die mounted on a second die pad. The first and second die pads are typically provided in adjacent relationship on a common leadframe. High voltage isolation structure is provided between the two dies. The two dies typically communicate electrically through at least one bond wire or other conductor, or wirelessly by optical or Radio Frequency communication. ICIDs of many different constructions and different types of voltage isolation structure are known in the art.

DETAILED DESCRIPTION

Figure 1:
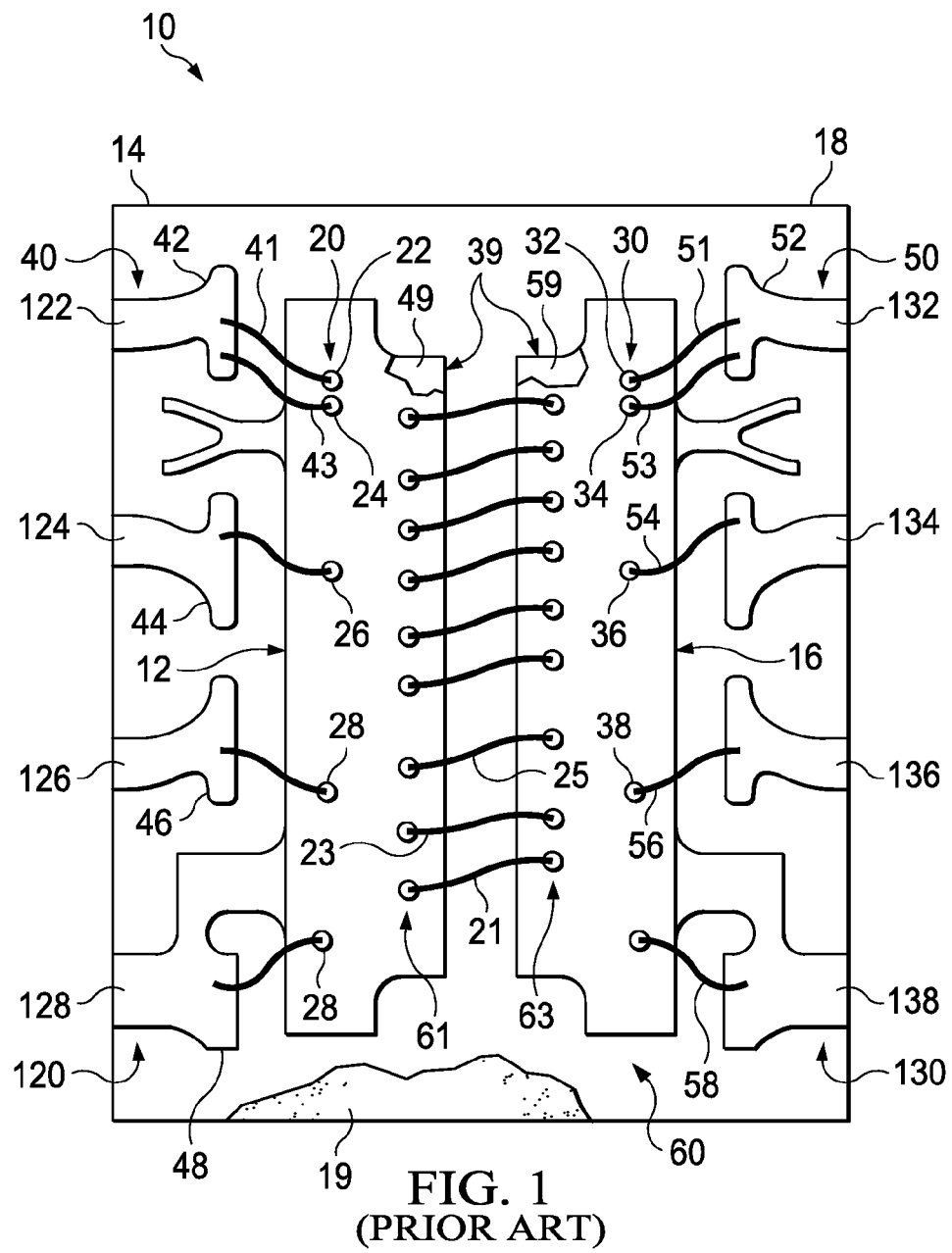
FIG. 1 is a top plan view of an ICID with various coatings and isolation structure removed to show the underlying dies, lead frame and typical internal electrical interconnects.

FIG. 1 illustrates a prior art integrated circuit isolation device (ICID) such as a dual channel isolator Interface IC, for example, Texas Instruments device ISO7221AD. The ICID 10 includes a first die 12 (shown partially cut away in FIGS. 1 and 2) provided on a first side 14 of the ICID 10. The first die 12 may be, for example, a Texas Instruments device ISO7221A_LE. The ICID 10 includes a second die 16 provided on a second side 18 of the ICID 10. The second die 16 may be, for example a Texas Instruments ISO7221A_RI. The first die 12 may have a first set of bond pads 20 which enable it to be electrically connected to external conductors, such as leadframe leads for further connection to other electronic devices. The first set of bond pads 20 may include a first bond pad 22, a second bond pad 24, a third bond pad 26, a fourth bond pad 28, etc. The second die 16 similarly contains a second set of bond pads 30, which may include a first bond pad 32, a second bond pad 34, a third bond pad 36, a fourth bond pad 38, etc.

The ICID 10 may include a leadframe 39 having a first die pad 49 on which the first die 12 is mounted. In the illustrated embodiment the die 12 covers the entire die pad 49. The leadframe 39 includes a first set of leads 40 including a first lead finger or lead 42, a second lead 44, a third lead 46 and a fourth lead 48, etc., that may be connected to respective ones of the conductor pads 20 on the first die 12 as by bond wires 41, 43, etc. The leads 42, 44, 46, 48 bond wires 41, 43, etc. and the die pads 20 may form a first set of conductors 120 including a first 122, second 124, third 126 fourth 128 conductors, etc., that transmit signals to/from the die 12.

The second die 16 may have a plurality of bond pads 30, which may include first 32, second 34, third 36, fourth 38, etc., bond pads. The leadframe 39 may include a second die pad 59 upon which the second die 16 is mounted. The leadframe 39 may also include a second set of lead fingers/lead pins ("leads") 50 including a first lead 52, a second lead 54, a third lead 56, a fourth lead 58, etc., which may be connected to respective contact pads 32, 34, 36, 38, etc., on the second die 16 as by bond wires 51, 53, etc. The second die bond pads 30, the bond wires 51, 53, etc. and the second set of leads 50 may form a second set of conductors 130 including a first 132, second 134, third 136, fourth 138, etc., conductors, that transmit signals to/from the second die 12.

The first die 12 may have a second set of bond pads 61 and the second die 16 may also have a second set of bond pads 63. The first die second set of bond pads 61 and the second die second set of bond pads 63 may be electrically connected by a plurality of bond wires 21, 23, 25, etc. or may communicate wirelessly.

Die pads 49, 59, the first set of leads 40, and the second set of leads 50 are supported by mold compound/encapsulant 19, which also covers the dies 12 and 16, and leadframe 39 and fills the spaces between them. The upper portion of the encapsulant 19 is broken away in FIGS. 1 and 2 for illustrative purposes. The die pads 49, 59 and the dies 12, 16 are thus separated by the mold compound 19 which provides a voltage isolation function.

The isolation function of the ICID 10 may be insufficient due to a number of different defects such as bubbles or voids or cracks in the ICID's encapsulating mold compound 19. This type of defect will allow high voltage transmission or arcing to occur within (typically die pad 49 to die pad 59) or externally (between exposed portions of leads 40 and 50) to the ICID 10.

Figure 2:
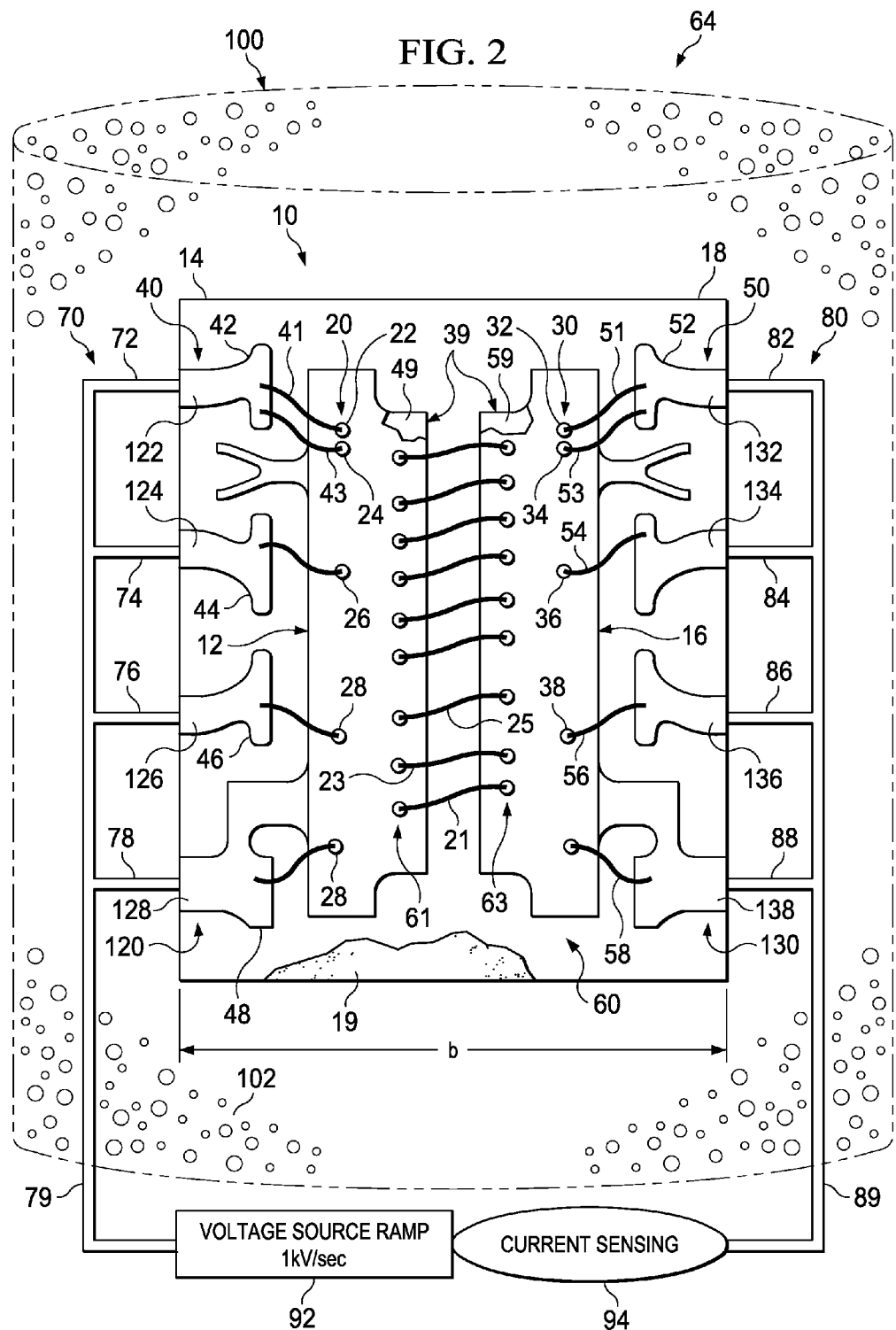
FIG. 2 is a schematic transparent view of an atmospheric isolation chamber containing a testing socket with an ICID as shown in FIG. 1 connected thereto.

With reference to FIG. 2, a nondestructive ICID test assembly 64 may include conventional first and second socket structures 70 and 80. The socket structure 70 may include first, second, third and fourth circuit branches 72, 74, 76, 78 that are connected to the first, second, third and fourth conductors 122, 124, 126, 128 that are electrically connected to the first die 12. The circuit branches 72, 74, 76, 78 are shorted together by main line 79.

Similarly, the second socket structure 80 has first, second, third and fourth branches 82, 84, 86, 88 shorted together in main line 89. The branches 82, 84, 86, 88 are connected to the second die 16 first, second, third and fourth conductors 132, 134, 136, 138 that are electrically connected to the second die 16.

A selectively variable voltage source 92 (a voltage source ramp) and a current sensor 94 may be connected in series between main lines 79 and 89. The voltage of source 92 may be increased in a linear ramp of, for example, 1 kV/sec. Alternatively, voltage may be increased in a nonlinear ramp or in incremental steps. The socket structures 70, 80 may be provided in an atmospheric isolation chamber 100, which is filled with a preselected gas such as helium. The gas used may be selected based upon the "isolation voltage limit" and the "clearance distance" of the particular ICID 10 that is to be tested, as discussed below.

Each model of ICID has a predetermined "isolation voltage limit," which may be defined generally as the maximum voltage to which the device may be connected without being damaged. Each ICID is manufactured in a package that has a predetermined clearance distance. "Clearance distance" is defined as the closest distance between anode and cathode. In the ICID 10 of FIG. 1, the clearance distance is the shortest distance between the closest two conductors on the isolated sides 14, 18 of the ICID, i.e., conductor 28 and conductor 58. In one example embodiment the ICID may be packaged in an 8 pin SOIC (8D) molded package (10) and may have a clearance distance of 4.2 mm. In this example, the 4.2 mm clearance would require testing to about 5,200V (the "breakdown voltage" of the device in air) to verify there were no defects in the clearance dimension. The example device (ISO7221AD) is rated for 1050V maximum test voltage and Transient Over Voltage of 4000V. The "isolation voltage limit" of the device is thus 1050V.

Currently most ICID devices 10 are not tested to determine whether they meet the criteria for clearance distance. The reason for this is that providing a sufficiently high test voltage to confirm that there is no arcing at the clearance distance (i.e., ramping the voltage to the breakdown voltage for the clearance distance) would take the ICID past its isolation voltage limit and thus damage the ICID. Currently, the only way that ICID devices are tested is by sampling and destructive testing. In some cases no testing at all is conducted and the manufacturer simply relies on the modeled characteristics of the particular ICID to predict proper operation in the field.

Applicant has developed a nondestructive method of testing ICID's that allows all ICID's to be tested prior to shipment to users. Applicant, in designing this nondestructive test procedure has taken into consideration and taken advantage of the relationship between an ICID's clearance distance with associated breakdown voltage and the ICID's isolation voltage limit. The voltage associated with any clearance distance is a function of the medium in which the ICID is located. In other words, different gases have different break down voltages at the same ICID clearance distance. However, the ICID's isolation voltage limit does not change with the medium in which the ICID is located. Applicant's method, in general, may comprises placing the ICID in a test gas atmosphere. The test gas used is a gas in which the ICID has a calculated test gas breakdown voltage at its predetermined clearance distance that is less than the isolation voltage limit of the ICID.

With reference to FIG. 2, the ICID 10 to be tested in mounted in the test assembly 64 and a voltage is applied between the first side 14 and the second side 18 of the ICID. This may be done by connecting a variable voltage source 92 to lines 79 and 89 described above. The voltage source 92 is then used to ramp the voltage applied across shorted together first die input/output conductors 120 and shorted together second die input/output conductors 130. If the voltage is ramped to the calculated test gas breakdown voltage without ICID failure, then the ICID passes the test. On the other hand, if failure of the ICID 10 occurs before the point that the calculated test gas break down voltage is reached, then the device is determined to be defective. The voltage source may be provided with a voltage limit equal to the breakdown voltage of the device under test.

One way that ICID failure may be detected is by monitoring the current through the device, as with a current sensor 94, as the voltage is ramped up. For example current flow indicating less than the specified isolation rating (for example $10^{11}$ Ohms) may indicates that an ICID failure has occurred. The particular current threshold that is determined to be "substantial" may vary with different types of ICID's.

Table 1 below shows a number of different ICID packages and an example of a predetermined clearance distance for each. Also shown is the break down voltage at the prescribed clearance distance in air. Also shown is the break down voltage at the clearance distance in a helium atmosphere. As can be seen from this chart, the break down voltage of each of these parts in helium is substantially less (about 7 to 10 times less) than it is in air. Also, for each of these products, the isolation voltage limit is between 0.74 kV and 3.7 kV. Thus, all of the break down voltages in helium shown in Table 1 are less than the lowest isolation voltage limit for any of these ICIDs. The acronym SSOP stands for "Shrink Small-Outline Package"; VSSOP stands for "Very thin Shrink Small Outline Package" and SOIC stands for "Small-Outline Integrated Circuit". RTB stands for "Ramp to Breakdown" and rms stands for "Root Mean Square".

| # Pins | Texas Instruments Product | Generic Description | Clearance (mm) | Air RTB kV (rms) | Helium RTB kV (rms) |
|---|---|---|---|---|---|
| 8 | DGK | VSSOP | 3.47 | 4.34 | 0.608 |
| 16 | DBQ | SSOP (JEDEC MO-137 variation AB) | 3.8 | 4.75 | 0.645 |
| 8 | D | SOIC (Narrow Body) | 4.27 | 5.33 | 0.687 |
| 16 | DW | SOIC (Wide Body) | 8.1 | 10.1 | 0.948 |
| 8 | DWV | SOIC (Wide Body + Wide Lead Form) | 8.8 | 11.0 | 0.995 |

Although testing of an integrated circuit isolation device (ICID) 10 has been specifically described herein it will be understood that the test assembly and testing methodology described herein is applicable to any device that has external contacts with a minimum clearance distance through air requirement. Some such devices may have a single die rather than multiple dies. For example a Texas Instruments voltage regulator part number TOS57040QDGRQ1 is one such device with clearance distance requirements between contacts on the device in which the anode and cathode of the device are not provided by separate dies. An IC device having such a minimum external clearance distance through air requirement between external contacts is referred to herein as "integrated circuit clearance distance device" or "ICCDD." An ICID is one type of ICCDD.

Figure 3:
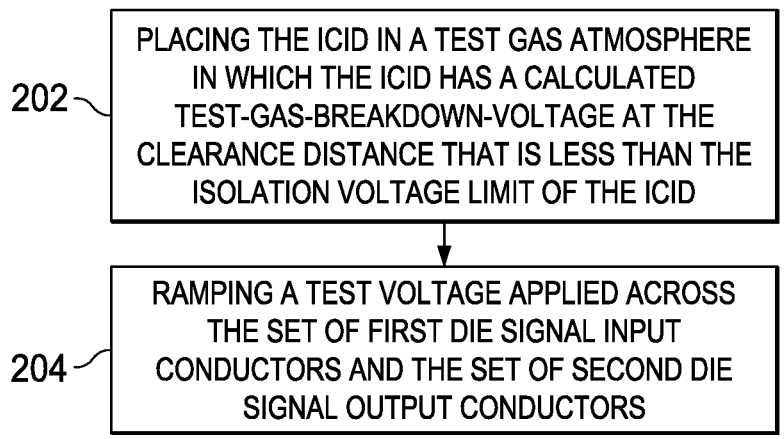
FIG. 3 is a flow diagram of a method of testing an ICID.

FIG. 3 shows a method of testing an integrated circuit isolation device (ICID) or other integrated circuit device with minimum clearance distance requirements. The ICID has a first die with a set of first die signal conductors located on a first side of the ICID and a second die with a set of second die signal conductors located on a second side of the ICID. The set of first die signal conductors are separated from the set of second die signal conductors by a predetermined clearance distance and the ICID has a predetermined isolation voltage limit. The method may include, as shown at block 202, placing the ICID in a test gas atmosphere in which the ICID has a calculated test-gas-breakdown-voltage at the clearance distance that is less than the isolation voltage limit of the ICID. The method may further include, as shown at 204, ramping a test voltage applied across the set of first die signal input conductors and the set of second die signal output conductors.

Figure 4:
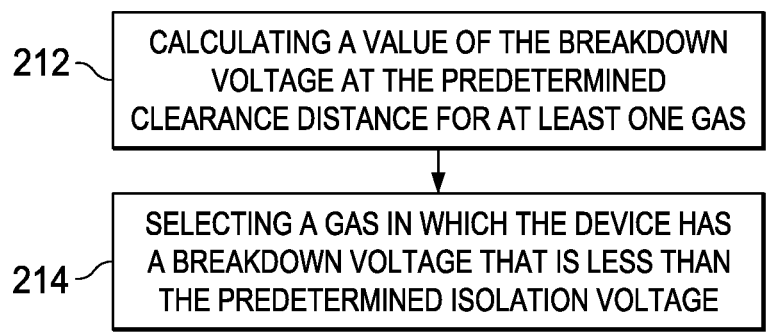
FIG. 4 is a flow diagram of a method of selecting a gas for an atmospheric isolation chamber used for testing an ICID.

FIG. 4 shows a method of testing an integrated circuit clearance distance device ("ICCDD") having a predetermined clearance distance in air requirement and a predetermined isolation voltage limit. The method may include, as shown at block 212, calculating a value of the breakdown voltage at the predetermined clearance distance for at least one gas. The method may also include, as shown at block 214, selecting a gas in which the device has a breakdown voltage that is less than the predetermined isolation voltage.

Example embodiments of a nondestructive testing assembly and method have been described in detail herein. Alternative embodiments of the testing assembly and method will occur to those skilled in the art after reading this disclosure. It is intended that the attached claims be broadly construed to cover all such alternative embodiments, except as limited by the prior art.

What is claimed is:

1. A method of testing an integrated circuit isolation device (ICID) having a first die with a set of first die signal conductors located on a first side of the ICID and a second die with a set of second die signal conductors located on a second side of the ICID, the set of first die signal conductors being separated from the set of second die signal conductors by a predetermined clearance distance, and wherein the ICID has a predetermined isolation voltage limit, comprising:

placing the ICID in a test gas atmosphere in which the ICID has a calculated test-gas-breakdown-voltage at the clearance distance that is less than the isolation voltage limit of the ICID; and increasing a test voltage applied across the set of first die signal conductors and the set of second die signal conductors.

2. The method of claim 1 wherein said increasing a test voltage comprises increasing the test voltage until whichever occurs first of: a) the test voltage reaching the calculated test-gas-breakdown-voltage and b) a current flow occurring at a rate that is indicative of ICID failure.

3. The method of claim 2 further comprising monitoring the test voltage and monitoring current flow through the ICID.

4. The method of claim 2 comprising rejecting an ICID as defective when the current flow rate indicative of ICID failure occurs before the test voltage reaches the test-gas-breakdown-voltage.

5. The method of claim 2 further comprising passing an ICID when the test voltage reaches the calculated test-gas-breakdown-voltage before the current flow rate indicative of ICID failure occurs.

6. The method of claim 1 wherein said placing the ICID in a test gas atmosphere comprises placing the ICID in a helium atmosphere.

7. The method of claim 1 further comprising shorting together the set of first die signal input conductors and shorting together the set of second die signal output conductors and applying the test voltage between said shorted set of first die signal input conductors and said shorted set of second die signal output conductors.

8. The method of claim 1 wherein said increasing a test voltage comprises increasing the test voltage in one of a continuous ramp and incremental steps.

9. The method of claim 1 comprising calculating a test-gas-breakdown-voltage for the ICID based upon the ICID clearance distance.

10. The method of claim 9 wherein the test gas is helium and the test-gas-breakdown voltage of the ICID is between about 0.6 kV and 0.995 kV and the isolation voltage limit of the ICID is between about 0.7 kV and 3.7 kV.

11. An assembly comprising:

an Integrated circuit isolation devices (ICID) having a first isolated die and a second isolated die, said first isolated die having a set of signal input conductors, said second isolated die having a set of signal output conductors, said ICID having a predetermined clearance distance and a predetermined isolation voltage limit;

a test voltage source connected across said set of signal input conductors and said set of signal output conductors; and an atmospheric isolation chamber containing a gas in which the ICID has a calculated test-gas-breakdown-voltage at the clearance distance that is less than the isolation voltage limit of the ICID, wherein said ICID is positioned inside said atmospheric isolation chamber.

12. The assembly of claim 11 wherein said atmospheric isolation chamber is filled with helium.

13. The assembly of claim 11 wherein said ICID is a VSSOP.

14. The assembly of claim 11 wherein said ICID is an SSOP.

15. The assembly of claim 11 wherein said ICID is an SOIC.

16. A method of testing an integrated circuit clearance distance device ("ICCDD") having a predetermined clearance distance in air requirement and a predetermined isolation voltage limit comprising:

calculating a value of the breakdown voltage at the predetermined clearance distance for at least one gas; and selecting a gas in which the ICCDD has a breakdown voltage that is less than the predetermined isolation voltage.

17. The method of claim 16 wherein said selecting a gas comprises selecting an inert gas.

18. The method of claim 16 wherein said selecting a gas comprises selecting helium.

19. The method of claim 16 further comprising filling an isolation chamber containing the ICCDD with the selected gas.

20. The method of claim 19 comprising increasing a test voltage applied across an anode side and a cathode side of the ICCDD.

* * * * *